US011239636B2

(12) United States Patent
Mitaki

(10) Patent No.: US 11,239,636 B2
(45) Date of Patent: Feb. 1, 2022

(54) BURIED TYPE SEMICONDUCTOR OPTICAL DEVICE AND MANUFACTURING METHOD THEREFOR

(71) Applicant: Lumentum Japan, Inc., Kanagawa (JP)

(72) Inventor: Masatoshi Mitaki, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 147 days.

(21) Appl. No.: 16/547,424

(22) Filed: Aug. 21, 2019

(65) Prior Publication Data

US 2021/0044091 A1 Feb. 11, 2021

(30) Foreign Application Priority Data

Aug. 6, 2019 (JP) .............................. JP2019-144888

(51) Int. Cl.
*H01S 5/22* (2006.01)
*H01S 5/227* (2006.01)
*H01L 33/00* (2010.01)
*H01S 5/34* (2006.01)
*H01S 5/32* (2006.01)

(52) U.S. Cl.
CPC .......... *H01S 5/2228* (2013.01); *H01L 33/005* (2013.01); *H01S 5/2272* (2013.01); *H01S 5/3216* (2013.01); *H01S 5/341* (2013.01)

(58) Field of Classification Search
CPC ...... H01S 5/2228; H01S 5/2272; H01S 5/341; H01S 5/3216; H01S 5/12; H01S 5/0265; H01S 5/2277; H01L 33/005
See application file for complete search history.

(56) References Cited

U.S. PATENT DOCUMENTS

| 4,870,468 A * | 9/1989 | Kinoshita ............... H01S 5/227 438/41 |
| 2020/0044417 A1 * | 2/2020 | Taniguchi ............. H01S 5/2235 |

FOREIGN PATENT DOCUMENTS

| JP | 2010-271667 A | 12/2010 |
| JP | 2012-019053 A | 1/2012 |

* cited by examiner

*Primary Examiner* — Xinning (Tom) Niu
(74) *Attorney, Agent, or Firm* — Harrity & Harrity, LLP

(57) ABSTRACT

A buried typed semiconductor optical device includes a semiconductor substrate having a pair of grooves extending in a first direction. An upper surface of a buried layer has a first region that is adjacent to a mesa stripe structure, overlaps with a corresponding one of the pair of grooves, is inclined so as to be higher in a second direction from the mesa stripe structure, and on which a passivation film is not formed. The upper surface of the buried layer has a second region that does not overlap with any of the pair of grooves, is flat, and is higher than a lower end of the first region, and on which the passivation film is formed. The upper surface of the buried layer has a connection region between the first region and the second region at a same height as the second region.

20 Claims, 23 Drawing Sheets

BURIED TYPE SEMICONDUCTOR OPTICAL DEVICE AND MANUFACTURING METHOD THEREFOR

CROSS-REFERENCE TO RELATED APPLICATION

This application claims priority to Japanese Patent Application No. 2019-144888, filed on Aug. 6, 2019, which is hereby expressly incorporated by reference herein.

TECHNICAL FIELD

This relates to a buried type semiconductor optical device and a manufacturing method therefor.

BACKGROUND

With the increase of traffic in the Internet and data centers, 100 Gbps products or 400 Gbps products are required. Semiconductor optical devices are required to have high speed that can operate at 25 Gbaud or 56 Gbaud. As a modulator for optical communication, a buried type semiconductor optical device, for example, an electro-absorption modulator (hereinafter, referred to as an electro-absorption (EA) modulator) is known.

In a buried type EA modulator, an electrode (p electrode) for applying a voltage to a mesa stripe structure is disposed not only immediately above the mesa stripe structure but also to cover a buried layer. In addition, an n electrode is formed on the back surface of a conductor substrate. The semiconductor region sandwiched between the p electrode and the n electrode causes parasitic capacitance. In order to improve the response of the EA modulator at high speed, reduction of parasitic capacitance is required.

SUMMARY

According to some possible implementations, a buried type semiconductor optical device may include a semiconductor substrate that includes a pair of grooves extending in a first direction and includes a convex portion extending in a stripe shape in a first direction between the pair of grooves to constitute a lower end of a mesa stripe structure; a quantum well layer that extends in a stripe shape in the first direction on the convex portion so as to constitute a part of the mesa stripe structure; a buried layer that is placed on the semiconductor substrate while being adjacent to both sides of the mesa stripe structure in a second direction orthogonal to the first direction so as to constitute a buried heterostructure; an electrode that extends continuously from an upper surface of the mesa stripe structure onto the buried layer and contacts the upper surface of the mesa stripe structure; and a passivation film that is interposed between a part of an upper surface of the buried layer and the electrode, wherein the upper surface of the buried layer includes a first region that is adjacent to the mesa stripe structure, overlaps with a corresponding one of the pair of grooves, is inclined so as to be higher in the second direction from the mesa stripe structure, and on which the passivation film is not formed a second region that does not overlap with any of the pair of grooves, is flat, and is higher than a lower end of the first region, and on which the passivation film is formed, and a connection region that is between the first region and the second region at a same height as the second region.

According to some possible implementations, an optical device may include a semiconductor substrate that includes a pair of grooves extending in a first direction and includes a convex portion extending in a stripe shape in a first direction between the pair of grooves to constitute a lower end of a mesa stripe structure; a quantum well layer that extends in a stripe shape in the first direction on the convex portion so as to constitute a part of the mesa stripe structure; a buried layer that is placed on the semiconductor substrate while being adjacent to both sides of the mesa stripe structure in a second direction orthogonal to the first direction so as to constitute a buried heterostructure; an electrode that extends continuously from an upper surface of the mesa stripe structure onto the buried layer and contacts the upper surface of the mesa stripe structure; and a passivation film that is interposed between a part of an upper surface of the buried layer and the electrode, wherein the upper surface of the buried layer includes a first region that is adjacent to the mesa stripe structure and overlaps with a corresponding one of the pair of grooves, a second, flat region that does not overlap with any of the pair of grooves, and a connection region that is between the first region and the second, flat region.

According to some possible implementations, a method of manufacturing a buried type semiconductor optical device may include preparing a semiconductor substrate that includes a pair of grooves extending in a first direction and a convex portion between the pair of grooves and is provided with a mesa stripe structure extending in a stripe shape in the first direction with the convex portion as a lower end portion, in which the mesa stripe structure includes a quantum well layer, a cladding layer, and a contact layer extending in a stripe shape in the first direction on the convex portion; forming a buried layer constituting a buried heterostructure by crystal growth so as to be placed on the semiconductor substrate while being adjacent to both sides of the mesa stripe structure in a second direction orthogonal to the first direction; forming a passivation film on a second region of an upper surface of the buried layer while avoiding a first region of the upper surface of the buried layer and an upper surface of the mesa stripe structure; and forming an electrode so as to be in contact with the upper surface of the mesa stripe structure and extend continuously from the upper surface of the mesa stripe structure onto the passivation film, wherein the first region is adjacent to the mesa stripe structure, overlaps with a corresponding one of the pair of grooves, and is inclined so as to be higher in the second direction from the mesa stripe structure, the second region does not overlap with any of the pair of grooves, is flat, and is higher than a lower end of the first region, and the upper surface of the buried layer further includes a connection region between the first region and the second region at a same height as the second region.

DETAILED DESCRIPTION

Figure 1A:
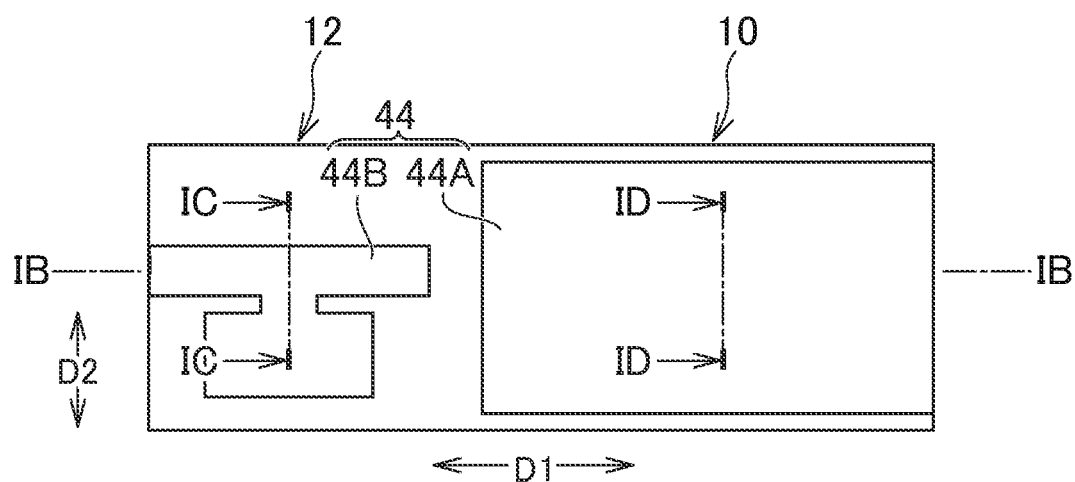
FIG. 1A is a plan view of a buried type semiconductor optical device according to a first embodiment.

Hereinafter, some embodiments will be described specifically and in detail with reference to drawings. In all the drawings to explain the embodiments, the members with the identical or same function bear the same reference numerals, and their repetitive description will be omitted. The drawings used below are only to explain examples in the embodiments, sizes of figures do not always comply with magnification in the examples.

Figure 1B:
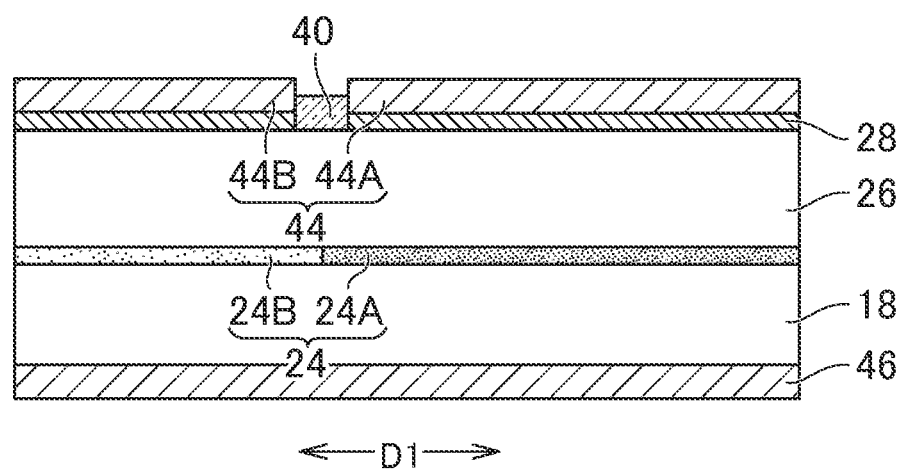
FIG. 1B is a cross-sectional view taken along the line IB-IB of the buried type semiconductor optical device shown in FIG. 1A.
Figure 1C:
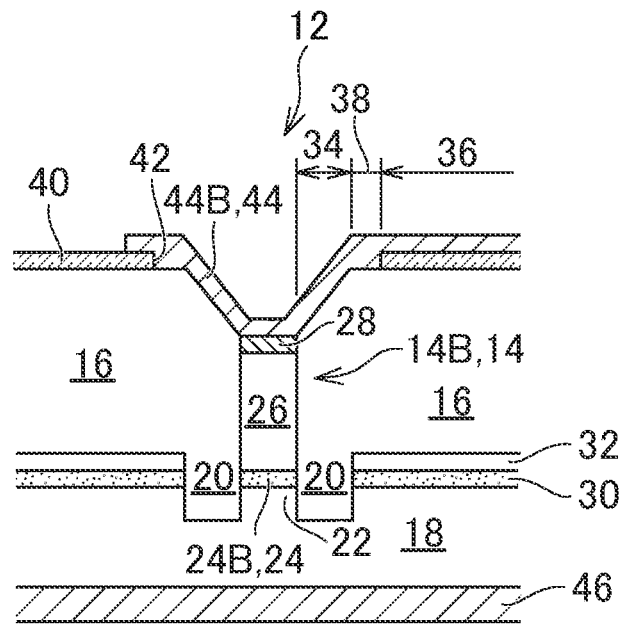
FIG. 1C is a cross-sectional view taken along the line IC-IC of the buried type semiconductor optical device shown in FIG. 1A.
Figure 1D:
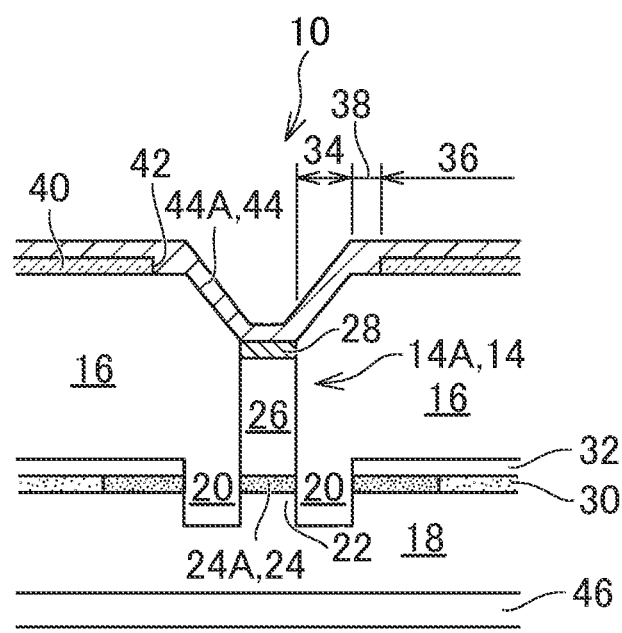
FIG. 1D is a cross-sectional view taken along the line ID-ID of the buried type semiconductor optical device shown in FIG. 1A.

FIG. 1A is a plan view of a buried type semiconductor optical device according to a first embodiment. FIG. 1B is a cross-sectional view taken along the line IB-IB of the buried type semiconductor optical device shown in FIG. 1A. FIG. 1C is a cross-sectional view taken along the line IC-IC of the buried type semiconductor optical device shown in FIG. 1A. FIG. 1D is a cross-sectional view taken along the line ID-ID of the buried type semiconductor optical device shown in FIG. 1A.

A semiconductor optical device modulates continuous light emitted by injecting a drive current into a laser unit 10 by a modulator unit 12 to output signal light. The semiconductor optical device is a modulator integrated semiconductor optical device (for example, modulator integrated laser) in which the laser unit 10 (for example, semiconductor laser) and the modulator unit 12 are monolithically integrated. The laser unit 10 is a distributed feedback semiconductor laser (DFB laser). The modulator unit 12 is an electro-absorption modulator (EA modulator). Electro-absorption modulators are widely used due to the small size thereof and low cost, as well as having the advantageous characteristics of low chirp (wave modulation), high extinction ratio, which is the difference between the ON level and the OFF level of an optical signal, and broad band. The semiconductor optical device is an EA modulator integrated DFB laser device.

The semiconductor optical device has a buried heterostructure (BH structure). The BH structure is a structure having a buried layer 16 on both sides of a mesa stripe structure 14 having an optical waveguide. Since the BH structure has a strong effect of confining light in a lateral direction and has a more circular far field pattern (FFP), the BH structure has an advantage of high coupling efficiency with an optical fiber, and further has excellent heat dissipation, and is widely used.

A semiconductor optical device has a semiconductor substrate 18 (n-type InP substrate). The semiconductor substrate 18 has a pair of grooves 20 extending in a first direction D1. By forming the pair of grooves 20, "rabbit ears" is not formed, and parasitic capacitance can be reduced. Details will be described in the description of a manufacturing method. The semiconductor substrate 18 has a convex portion 22. The convex portion 22 extends in a stripe shape in the first direction D1 between the pair of grooves 20. The convex portion 22 constitutes a lower end portion of the mesa stripe structure 14.

The mesa stripe structure 14 includes a first mesa stripe structure 14A for a laser as shown in FIG. 1D. The first mesa stripe structure 14A includes a lower light guide layer (InGaAsP layer), a first quantum well layer 24A (active layer), an upper light guide layer (InGaAsP layer), a diffraction grating layer, and a cap layer (p-InP layer) in order from the side closer to the semiconductor substrate 18 (convex portion 22).

The mesa stripe structure 14 includes a second mesa stripe structure 14B for a modulator, as shown in FIG. 1C. The second mesa stripe structure 14B includes a lower light guide layer (InGaAsP layer), a second quantum well layer 24B (absorption layer), an upper light guide layer (InGaAsP layer), and a cap layer (p-InP layer) in order from the side closer to the semiconductor substrate 18 (convex portion 22).

The semiconductor optical device has a quantum well layer 24. The quantum well layer 24 includes a first quantum well layer 24A for the laser and a second quantum well layer 24B for the modulator. The quantum well layer 24 is made of an intrinsic semiconductor not intentionally doped with p-type or n-type impurities. The quantum well layer 24 constitutes a part of the mesa stripe structure 14. The quantum well layer 24 extends in a stripe shape in the first direction D1 on the convex portion 22.

The quantum well layer 24 is a multiple quantum well (MQW) layer. When an electric field is applied to the MQW layer, a quantum-confined Stark effect (QCSE) is obtained in which the absorption edge of light in the MQW layer is shifted to the long wavelength side. The EA modulator modulates light by using QCSE. The MQW layer includes a plurality of strained quantum well layers 24 (InGaAsP) and a barrier layer interposed between the adjacent quantum well layers 24.

The mesa stripe structure 14 has a cladding layer 26 on the quantum well layer 24. The cladding layer 26 extends in a stripe shape in the first direction D1. The cladding layer 26 is made of a semiconductor (p-type InP) doped with zinc (Zn), which is a p-type impurity.

The mesa stripe structure 14 includes a contact layer 28. The contact layer 28 is made of a p-type InGaAsP layer and a p-type InGaAs layer which are doped with a p-type impurity (Zn), respectively.

The semiconductor optical device has a dummy quantum well layer 30. The dummy quantum well layer 30 is interposed between the buried layer 16 and the semiconductor substrate 18 while avoiding overlapping with the pair of grooves 20. The dummy quantum well layer 30 is made of the same material as the quantum well layer 24 and is uniform in thickness with the quantum well layer 24.

The semiconductor optical device has a dummy cladding layer 32. The dummy cladding layer 32 intervenes between the buried layer 16 and the dummy quantum well layer 30. The dummy cladding layer 32 is made of the same material as the cladding layer 26 and smaller in thickness than the cladding layer 26.

The semiconductor optical device has the buried layer 16. The buried layer 16 is made of a semi-insulating semiconductor material. The buried layer 16 is made of a semiconductor (for example, InP) doped with iron (Fe) or ruthenium (Ru). The buried layer 16 is placed on the upper surface of the semiconductor substrate 18.

The buried layer 16 constitutes a buried heterostructure. The buried layer 16 is placed on the semiconductor substrate 18 while being adjacent to both sides of the mesa stripe structure 14 in a second direction D2. The buried layer 16 is in direct contact with the semiconductor substrate 18 by the pair of grooves 20. The buried layer 16 is in direct contact with the dummy cladding layer 32.

The upper surface of the buried layer 16 includes a first region 34. The first region 34 is adjacent to the mesa stripe structure 14. The first region 34 overlaps with a corresponding one of the pair of grooves 20. The first region 34 is inclined so as to be high in a second direction D2 from the mesa stripe structure 14. The lower end of the first region 34 is at the same height as the upper surface of the mesa stripe structure 14 (the upper surface of the contact layer 28).

The upper surface of the buried layer 16 includes a second region 36. The second region 36 does not overlap with any of the pair of grooves 20. The second region 36 overlaps with the dummy cladding layer 32. The second region 36 is flat and is higher than the lower end of the first region 34.

Figure 15:
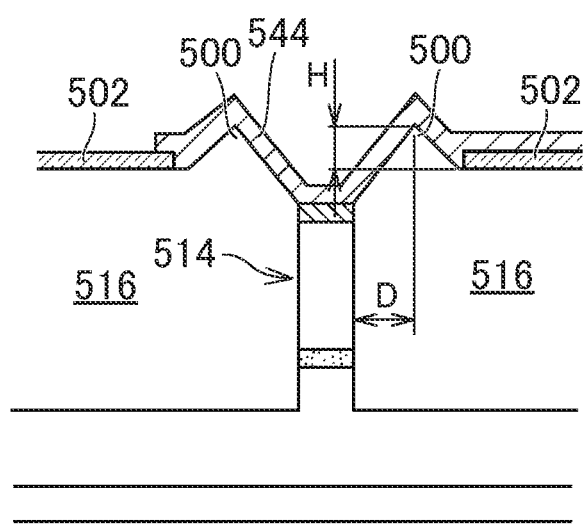
FIG. 15 is a view showing a buried type semiconductor optical device according to the related art.

The upper surface of the buried layer 16 includes a connection region 38. The connection region 38 is between the first region 34 and the second region 36. Here, the same height means that the height is the same in the in-plane distribution of the semiconductor layer by the same wafer process. A region higher than the pair of grooves 20 is formed on the lower layer side of the second region 36 (the dummy quantum well layer 30 and the dummy cladding layer 32). Therefore, the flat region shown in FIG. 15 is raised by an amount corresponding to a height H of the apex of the rabbit ears, and sharp regions like rabbit ears may not be formed.

The semiconductor optical device has a passivation film 40. The buried layer 16 is covered by the passivation film 40. The passivation film 40 has a through hole 42. The upper surface of the mesa stripe structure 14 (contact layer 28) is exposed in the through hole 42, and a part of the upper surface of the buried layer 16 (first region 34 and connection region 38) is also exposed adjacent thereto. In the present embodiment, since the rabbit ears is not formed, the start point of the second region 36 can be made closer to the mesa stripe structure 14 as compared with the state of FIG. 15. Therefore, the opening width of the through hole 42 can be narrowed.

The passivation film 40 is not formed in the first region 34. The passivation film 40 is not formed in the connection region 38. The passivation film 40 is formed in the second region 36. The passivation film 40 intervenes between a part of the upper surface of the buried layer 16 (second region 36) and an electrode 44.

The semiconductor optical device has the electrode 44 (p electrode). The electrode 44 extends continuously from the upper surface of the mesa stripe structure 14 (the top surface of the contact layer 28) onto the buried layer 16. The electrode 44 contacts the upper surface of the mesa stripe structure 14 (the top surface of the contact layer 28). The electrode 44 is electrically connected to the contact layer 28 in the through hole 42. The electrode 44 is placed on the passivation film 40. The electrode 44 includes a first electrode 44A for the laser and a second electrode 44B for the modulator. In the present embodiment, since rabbit ears is not formed as described above, the opening width of the through hole 42 can be narrowed, and the width of the second electrode 44B can be narrowed accordingly. Furthermore, even if a thick buried layer 16 is formed such that large rabbit ears is formed, the width of the through hole 42 can be reduced, and therefore, it is possible to reduce the electrode width while thickening the buried layer 16 at the same time and reduce parasitic capacitance.

Another electrode 46 (n electrode) is formed on the back surface of the semiconductor substrate 18. The electrode 46 (n electrode) faces the first electrode 44A and the second electrode 44B in common. The semiconductor optical device has an antireflective film (not shown) on the end surface from which light is emitted and has a highly reflective film (not shown) on the opposite end surface. In the present embodiment, the semiconductor substrate 18 is shown as an n-type, and the cladding layer 26 is shown as a p-type, but p-type and n-type may be reversed.

Next, a manufacturing method of the buried type semiconductor optical device according to the first embodiment will be described.

Semiconductor materials (for example, InP) have a property that crystal growth proceeds in a (111) plane direction. Therefore, as shown in FIG. 15, when the height of the mesa stripe structure 514 is exceeded, crystal growth proceeds at an angle of about 55 degrees on both sides thereof. When proceeds to a certain extent, the inclination of the crystal growth is reversed in the direction at the apex, and a projection 500 called "rabbit ears" is formed in the buried layer 516. Next to the protrusion 500, the buried layer 516 has the flat region 502.

As a preliminary preparation, a buried type semiconductor optical device (dummy element) having a structure in which "rabbit ears" may be formed is prepared, and the height (height H from the flat region 502) and position (horizontal distance D from the mesa stripe structure 14 to the apex) of the "rabbit ears" are measured. The dummy element is an element for position confirmation and may be prepared once at the time of development, and is not necessary at the time of mass production.

Figure 2:
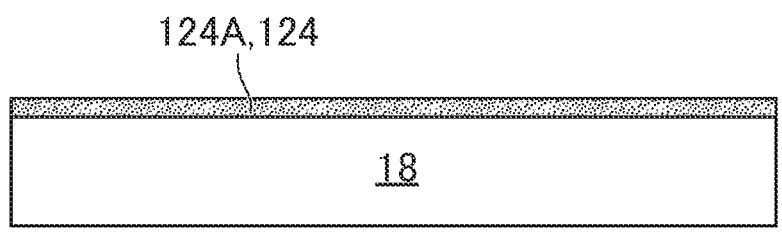
FIG. 2 is a view showing the formation process of a continuous quantum well layer.

FIG. 2 is a view showing the formation process of a continuous quantum well layer. A continuous quantum well layer 124 including a portion to be the quantum well layer 24 is formed on the semiconductor substrate 18 (n-type InP substrate). The continuous quantum well layer 124 includes a first continuous quantum well layer 124A for the laser. The first continuous quantum well layer 124A is included in a continuous multilayer for the laser (not shown).

Specifically, the continuous multilayer for the laser is formed on the semiconductor substrate 18 by a metal organic chemical vapor deposition (MOCVD) method. The continuous multilayer for the laser includes a continuous lower light guide layer (InGaAsP layer), a first continuous quantum well layer 124A, a continuous upper light guide layer (InGaAsP layer), a continuous grating layer, and a continuous cap layer (p-InP layer) in order from the semiconductor substrate 18 side.

The first continuous quantum well layer 124A is formed by using an InGaAsP-based material, but may be formed by using an InGaAlAs-based material.

Figure 3A:
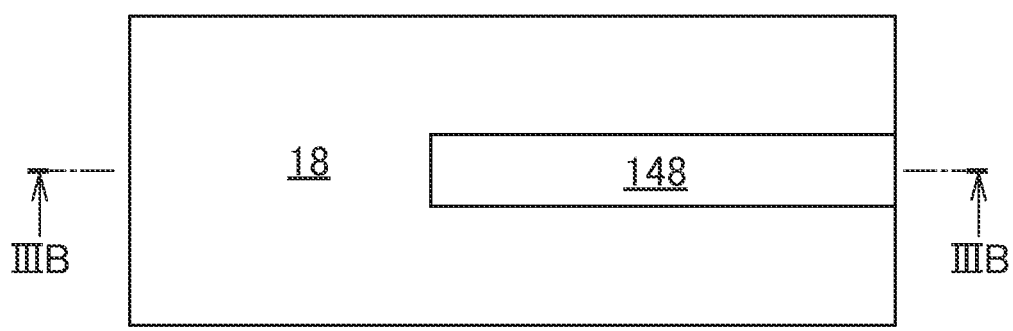
FIG. 3A is a view showing the etching of a first continuous quantum well layer.
Figure 3B:
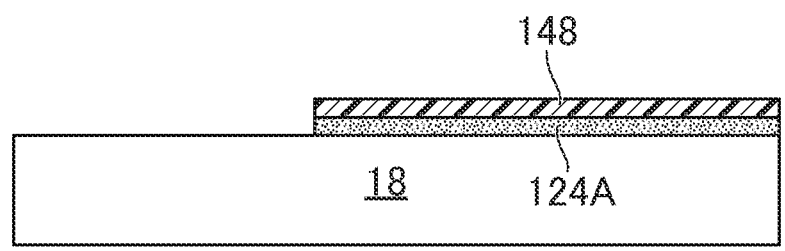
FIG. 3B is a cross-sectional view taken along the line IIIB-IIIB of the structure shown in FIG. 3A.

FIG. 3A is a view showing the etching of the first continuous quantum well layer. FIG. 3B is a cross-sectional view taken along the line IIIB-IIIB of the structure shown in FIG. 3A. A laser mask 148 is formed on the continuous multilayer for the laser including the first continuous quantum well layer 124A. The laser mask 148 is formed in a region including the first mesa stripe structure 14A for the laser. The continuous multilayer for the laser (first continuous quantum well layer 124A) is etched through the laser mask 148.

Figure 4A:
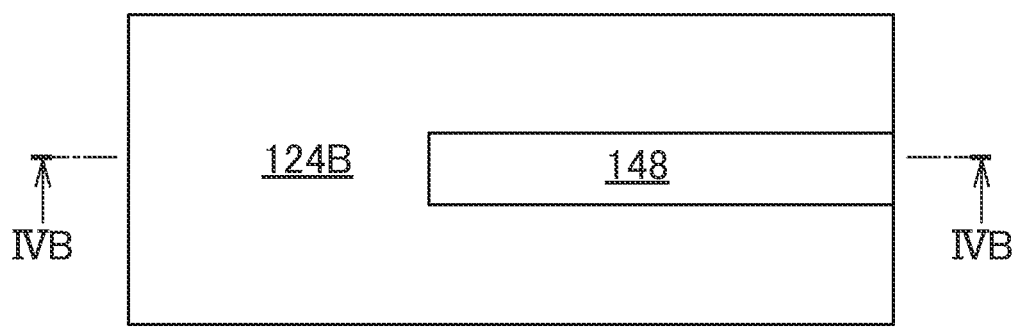
FIG. 4A is a view showing the formation process of the continuous quantum well layer.
Figure 4B:
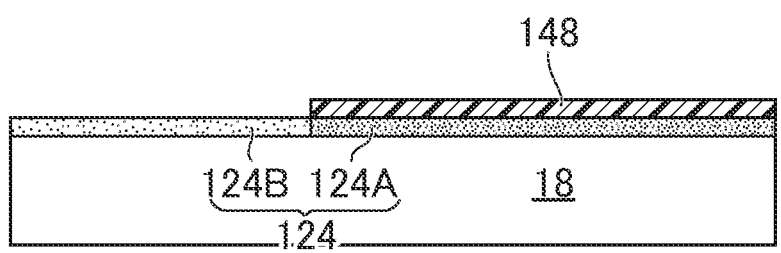
FIG. 4B is a cross-sectional view taken along the line IVB-IVB of the structure shown in FIG. 4A.

FIG. 4A is a view showing the formation process of the continuous quantum well layer. FIG. 4B is a cross-sectional view taken along the line IVB-IVB of the structure shown in FIG. 4A. The continuous quantum well layer 124 includes a second continuous quantum well layer 124B for the modulator. The second continuous quantum well layer 124B is included in a continuous multilayer for the modulator (not shown).

A continuous multilayer for the modulator is formed by the MOCVD method. The region covered by the laser mask 148 is not grown in multiple layers. The continuous multilayer for the modulator includes a continuous lower light guide layer (InGaAsP layer), a second continuous quantum well layer 124B (absorption layer), a continuous upper light guide layer (InGaAsP layer), and a continuous cap layer (p-InP layer) in order from the semiconductor substrate 18 side. An InGaAlAs-based material may be used for the second continuous quantum well layer 124B.

Then, the laser mask 148 is removed. Although not shown, the continuous cap layer for the laser in the continuous multilayer for the laser is removed, and the continuous grating layer is etched to form a diffraction grating.

Figure 5A:
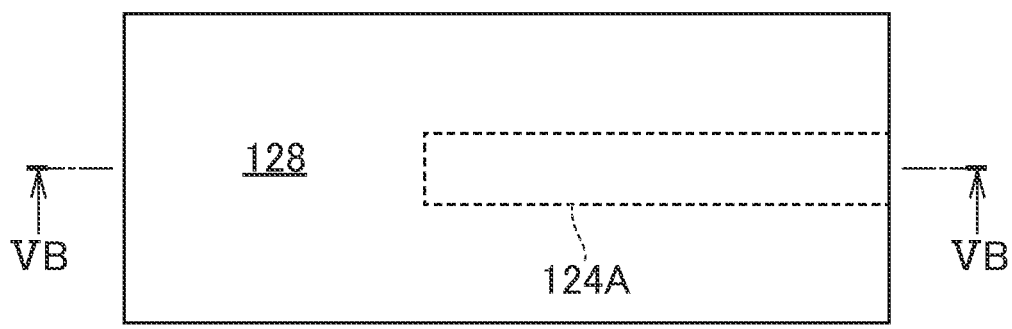
FIG. 5A is a view showing the formation process of a continuous cladding layer.
Figure 5B:
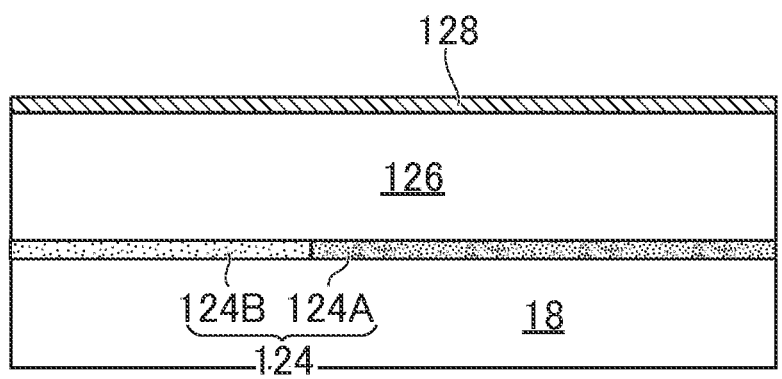
FIG. 5B is a cross-sectional view taken along the line VB-VB of the structure shown in FIG. 5A.

FIG. 5A is a view showing the formation process of a continuous cladding layer. FIG. 5B is a cross-sectional view taken along the line VB-VB of the structure shown in FIG. 5A.

On the continuous quantum well layer 124, a continuous cladding layer 126 including a portion to be the cladding layer 26 is formed. A continuous contact layer 128 including a portion to be the contact layer 28 is formed on the continuous cladding layer 126. The continuous cladding layer 126 (p-InP layer) and the continuous contact layer 128 (p-InGaAsP layer and p-InGaAs layer) are formed by crystal growth. The continuous cap layer for the modulator on top of the continuous multilayer for the modulator is substantially integrated with the continuous cladding layer 126.

Figure 6A:
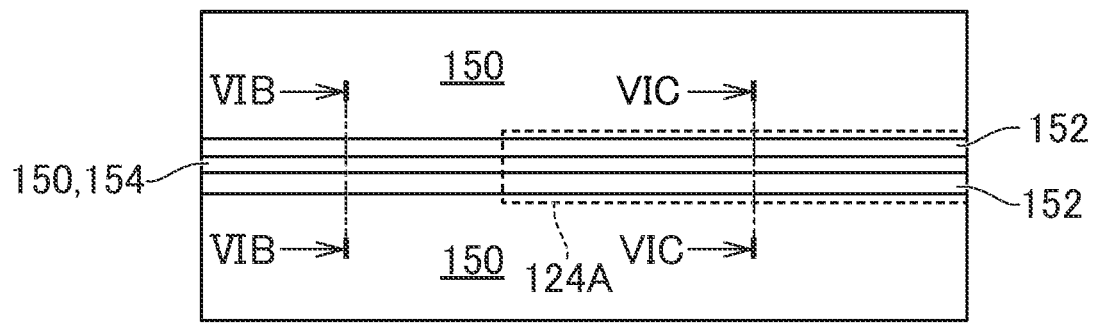
FIG. 6A is a view showing an etching mask.
Figure 6B:
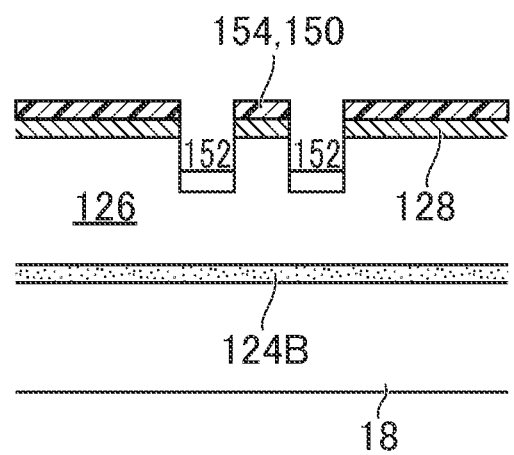
FIG. 6B is a cross-sectional view taken along the line VIB-VIB of the structure shown in FIG. 6A.
Figure 6C:
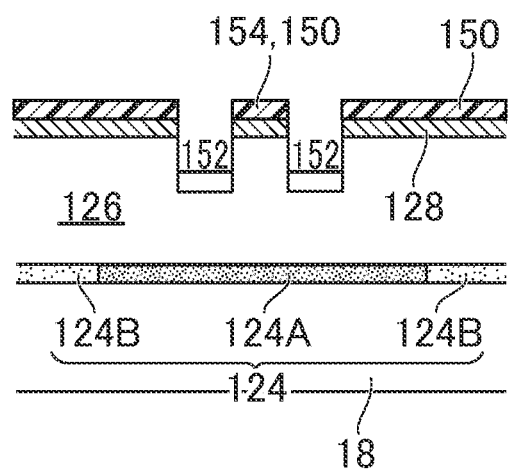
FIG. 6C is a cross-sectional view taken along the line VIC-VIC of the structure shown in FIG. 6A.

FIG. 6A is a view showing an etching mask. FIG. 6B is a cross-sectional view taken along the line VIB-VIB of the structure shown in FIG. 6A. FIG. 6C is a cross-sectional view taken along the line VIC-VIC of the structure shown in FIG. 6A.

An etching mask 150 having openings corresponding to the pair of grooves 20 is formed on the continuous contact layer 128. The positions of the pair of grooves 20 are determined from the positions of "rabbit ears" shown in FIG. 15.

Recessed portions 152 corresponding to the pair of grooves 20 are formed in the continuous contact layer 128 and the continuous cladding layer 126 so as not to reach the semiconductor substrate 18 through the etching mask 150. The depth of the recessed portion 152 is equal to the depth of the pair of grooves 20 described later. The depth of the pair of grooves 20 is determined from the height H of the "rabbit ears" obtained from the dummy element shown in FIG. 15.

Subsequently, the etching mask 150 is removed so that a part of the etching mask 150 is left as a mesa mask portion 154 in a region corresponding to the mesa stripe structure 14 (see FIGS. 7A to 7C).

Figure 7A:
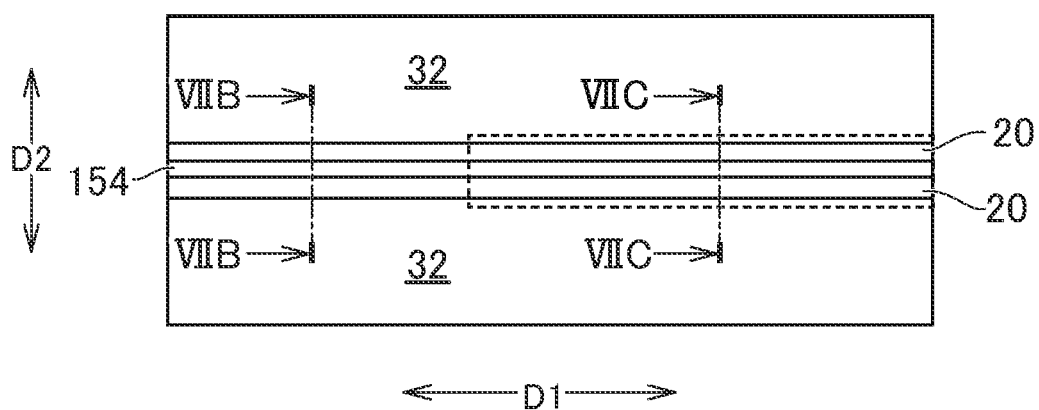
FIG. 7A is a view showing the etching.

FIG. 7A is a view showing the etching. FIG. 7B is a cross-sectional view taken along the line VIIB-VIIB of the structure shown in FIG. 7A. FIG. 7C is a cross-sectional view taken along the line VIIC-VIIC of the structure shown in FIG. 7A.

The continuous contact layer 128, the continuous cladding layer 126, the continuous quantum well layer 124, and the semiconductor substrate 18 are etched. Etching is performed with the continuous contact layer 128 covered by the mesa mask portion 154. Etching is performed until the pair of grooves 20 is formed in the semiconductor substrate 18.

The pair of grooves 20 extending in the first direction D1 is formed by etching. The convex portion 22 is formed between the pair of grooves 20. The mesa stripe structure 14 extending in a stripe shape in the first direction D1 is formed with the convex portion 22 as the lower end portion. The mesa stripe structure 14 includes the quantum well layer 24, the cladding layer 26, and the contact layer 28 extending in the first direction D1 on the convex portion 22 in a stripe shape.

In the etching process, the lower layer portion of the continuous cladding layer 126 is left as the dummy cladding layer 32 except for the region corresponding to the pair of grooves 20. Below the dummy cladding layer 32 is the dummy quantum well layer 30. Here, the height from the bottom of the pair of grooves 20 to the continuous quantum well layer 124 is the same as that of the dummy element (FIG. 15) formed in advance.

Figure 8A:
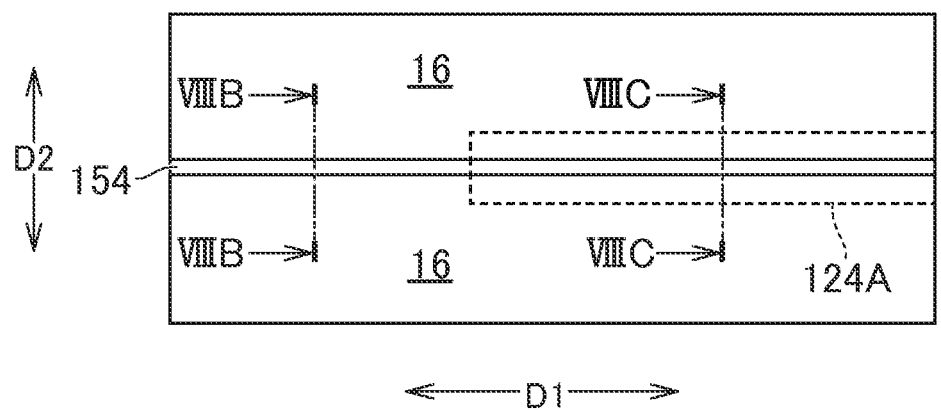
FIG. 8A is a view showing the formation process of the buried layer.
Figure 8B:
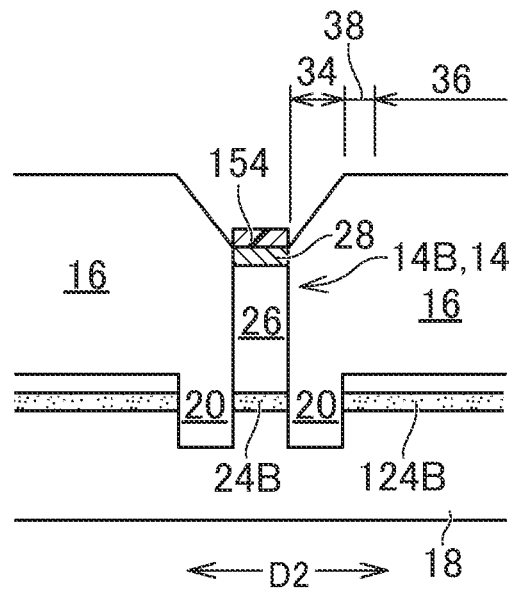
FIG. 8B is a cross-sectional view taken along the line VIIIB-VIIIB of the structure shown in FIG. 8A.
Figure 8C:
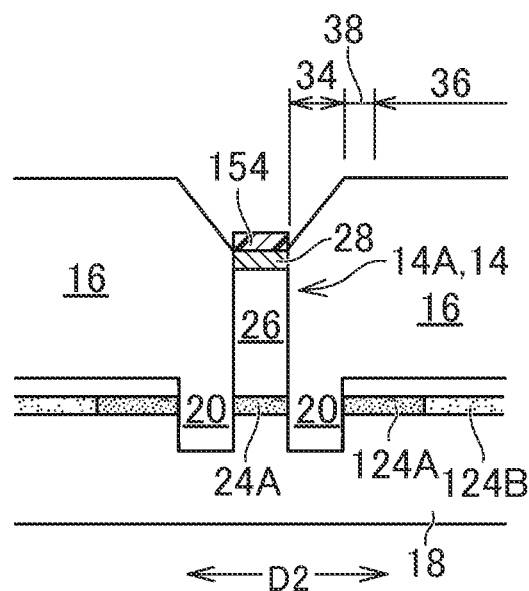
FIG. 8C is a cross-sectional view taken along the line VIIIC-VIIIC of the structure shown in FIG. 8A.

FIG. 8A is a view showing the formation process of the buried layer. FIG. 8B is a cross-sectional view taken along the line VIIIB-VIIIB of the structure shown in FIG. 8A. FIG. 8C is a cross-sectional view taken along the line VIIIC-VIIIC of the structure shown in FIG. 8A.

The buried layer 16 constituting the buried heterostructure is formed by crystal growth. The buried layer 16 is formed to be placed on the semiconductor substrate 18. The buried layer 16 is formed to be adjacent to both sides of the mesa stripe structure 14 in the second direction D2 orthogonal to the first direction D1.

The buried layer 16 is formed such that the upper surface includes the first region 34. The first region 34 is adjacent to the mesa stripe structure 14, overlaps with a corresponding one of the pair of grooves 20, and is inclined so as to be higher in the second direction D2 from the mesa stripe structure 14. The crystal growth is based on the crystal of the semiconductor substrate 18 below the first region 34.

The buried layer 16 is formed such that the upper surface includes the second region 36. The second region 36 does not overlap with any of the pair of grooves 20, is flat, and is higher than the lower end of the first region 34. The crystal growth is based on the crystal of the continuous cladding layer 126 below the second region 36.

The buried layer 16 is formed such that the upper surface includes the connection region 38. The connection region 38 is between the first region 34 and the second region 36.

By forming the buried layer 16 thick, parasitic capacitance can be reduced. However, since the rabbit ears are formed, it may be necessary to position the opening of the through hole in the flat region 502. As a result, the electrode width widens and parasitic capacitance increases. However, in the present embodiment, the rabbit ears are not formed even in a case where the buried layer 16 having the same thickness as the dummy element is formed. This is because the dummy quantum well layer 30, the dummy cladding layer 32, and the like are formed in the region from the vicinity of the apex of the rabbit ears to the outside, it is possible to raise the bottom of the outside from the apex of the rabbit ears, and the second region 36 can be formed from near the apex of the rabbit ears. As a result, the starting point of the flat region can be made closer to the mesa stripe structure, and the electrode width can be reduced.

Figure 9A:
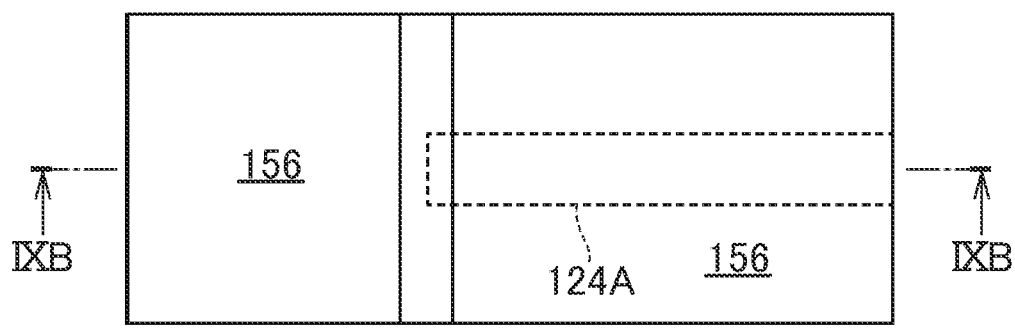
FIG. 9A is a view showing the separation process of a continuous contact layer.
Figure 9B:
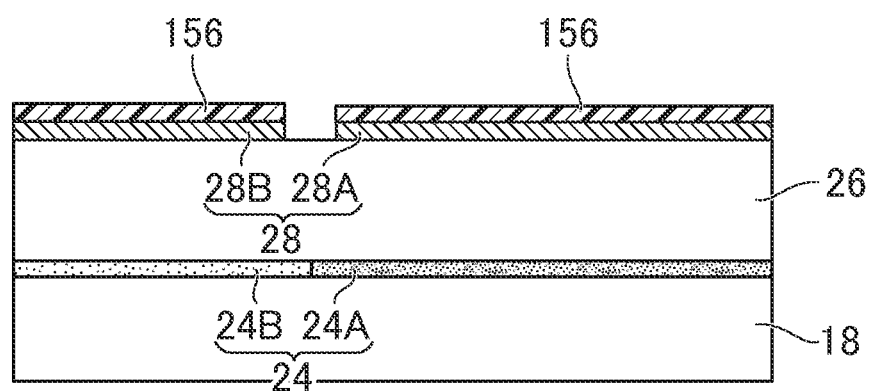
FIG. 9B is a cross-sectional view taken along the line IXB-IXB of the structure shown in FIG. 9A.

FIG. 9A is a view showing the separation process of the continuous contact layer. FIG. 9B is a cross-sectional view taken along the line IXB-IXB of the structure shown in FIG. 9A.

The mesa mask portion 154 is removed, and an isolation mask 156 having an opening or a break between the modulator portion 12 and the laser portion 10 is formed. A part of the continuous contact layer 128 (a portion between the laser portion 10 and the modulator portion 12) is removed through the isolation mask 156. In this way, the continuous contact layer 128 is separated into a contact layer 28A for the laser and a contact layer 28B for the modulator. Thereafter, the isolation mask 156 is removed.

Figure 10A:
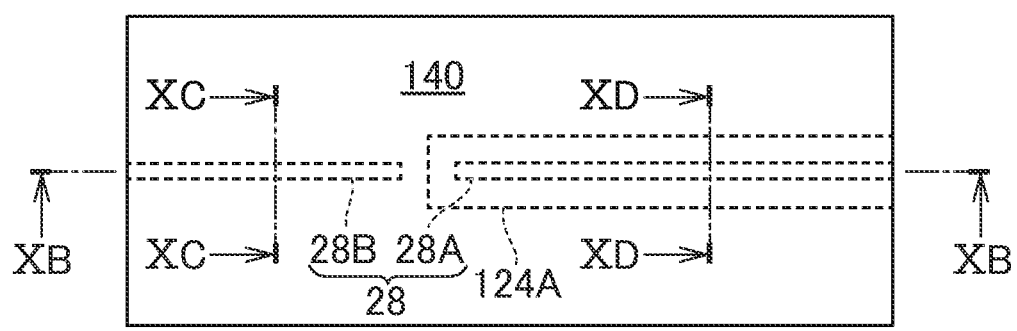
FIG. 10A is a view showing the formation process of a continuous passivation film.
Figure 10B:
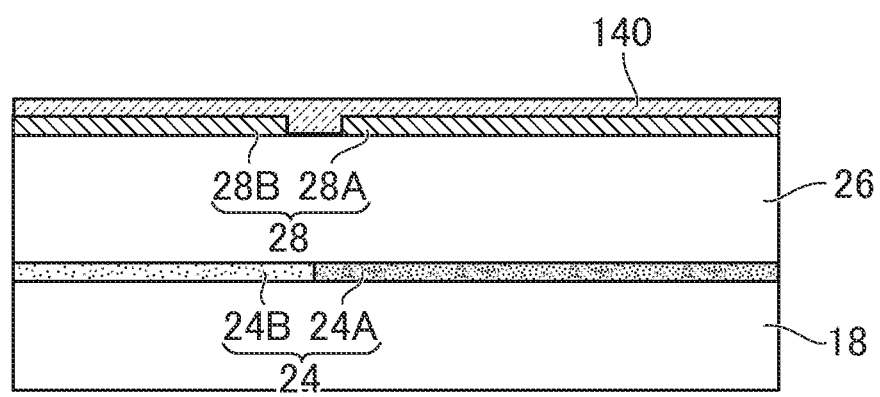
FIG. 10B is a cross-sectional view taken along the line XB-XB of the structure shown in FIG. 10A.
Figure 10C:
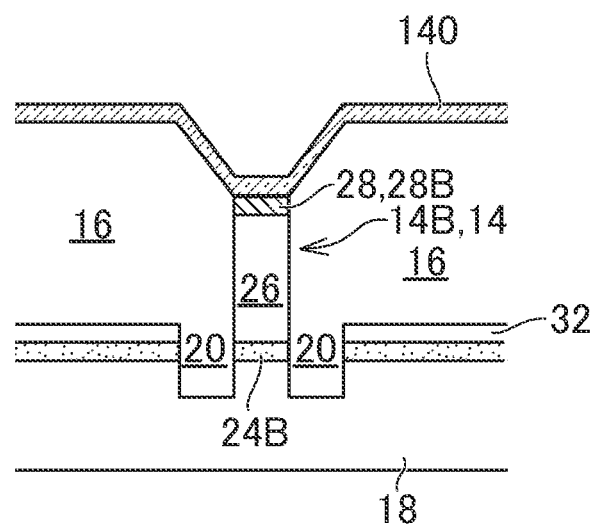
FIG. 10C is a cross-sectional view taken along the line XC-XC of the structure shown in FIG. 10A.
Figure 10D:
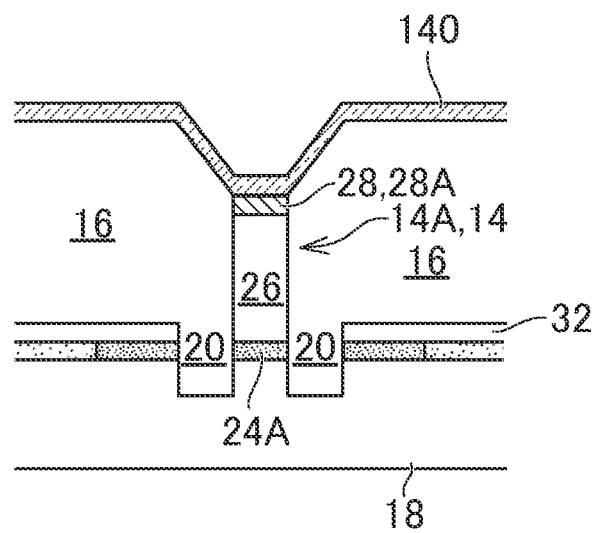
FIG. 10D is a cross-sectional view taken along the line XD-XD of the structure shown in FIG. 10A.

FIG. 10A is a view showing the formation process of a continuous passivation film. FIG. 10B is a cross-sectional view taken along the line XB-XB of the structure shown in FIG. 10A. FIG. 10C is a cross-sectional view taken along the line XC-XC of the structure shown in FIG. 10A. FIG. 10D is a cross-sectional view taken along the line XD-XD of the structure shown in FIG. 10A. A continuous passivation film 140 is formed on the contact layer 28 and on the buried layer 16.

Figure 11A:
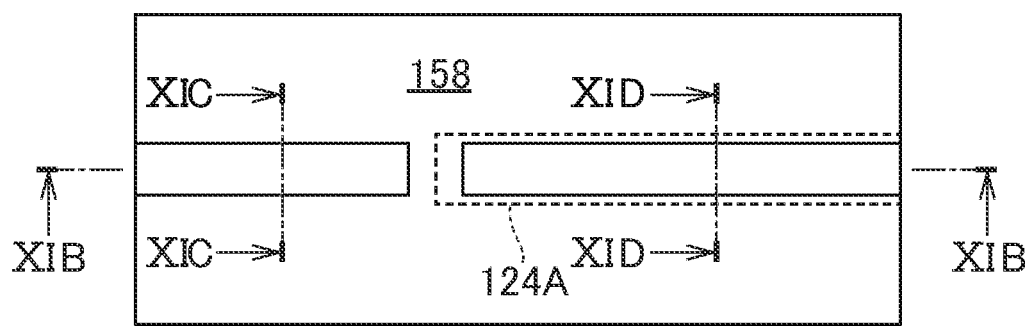
FIG. 11A is a view showing the etching of the continuous passivation film.
Figure 11B:
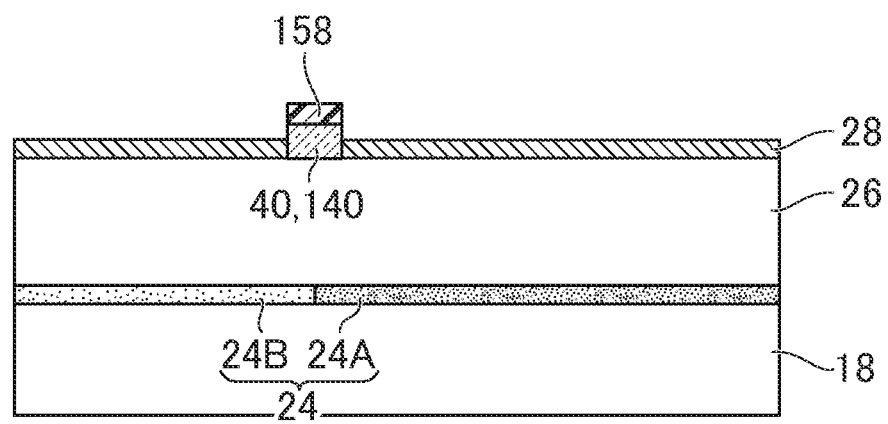
FIG. 11B is a cross-sectional view taken along the line XIB-XIB of the structure shown in FIG. 11A.
Figure 11C:
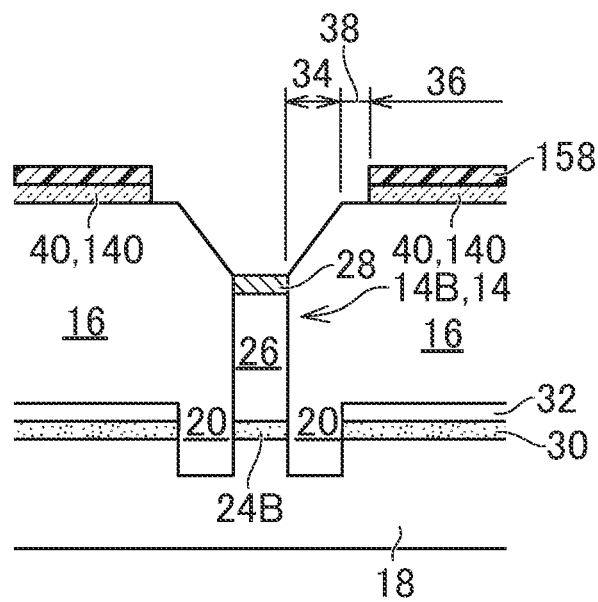
FIG. 11C is a cross-sectional view taken along the line XIC-XIC of the structure shown in FIG. 11A.
Figure 11D:
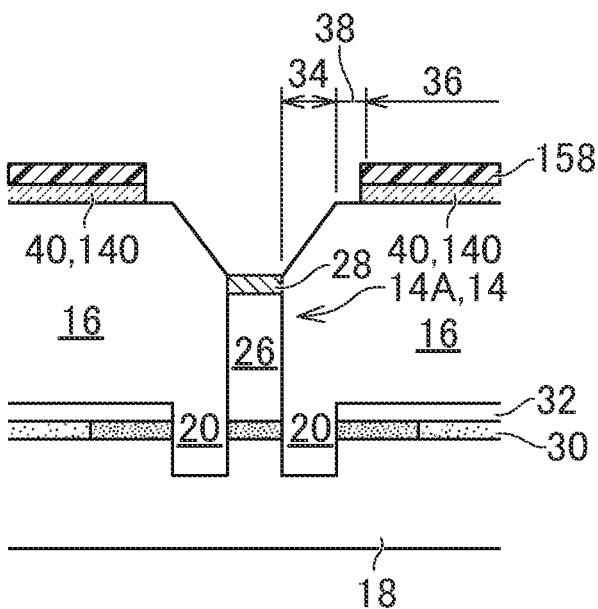
FIG. 11D is a cross-sectional view taken along the line XID-XID of the structure shown in FIG. 11A.

FIG. 11A is a view showing the etching of the continuous passivation film. FIG. 11B is a cross-sectional view taken along the line XIB-XIB of the structure shown in FIG. 11A. FIG. 11C is a cross-sectional view taken along the line XIC-XIC of the structure shown in FIG. 11A. FIG. 11D is a cross-sectional view taken along the line XID-XID of the structure shown in FIG. 11A.

A through hole mask 158 is formed on the continuous passivation film 140. The through hole mask 158 has an opening or a break on the first region 34 and the connection region 38 on the upper surface of the mesa stripe structure 14 (first mesa stripe structure 14A for the laser and second mesa stripe structure 14B for the modulator) and the buried layer 16.

The continuous passivation film 140 is etched through the through hole mask 158. The passivation film 40 patterned in this way is left in the second region 36 on the upper surface of the buried layer 16. The passivation film 40 is formed while avoiding the upper surface of the mesa stripe structure 14. The passivation film 40 is formed while avoiding the first region 34 and the connection region 38 on the upper surface of the buried layer 16. Thereafter, the through hole mask 158 is removed.

As shown in FIGS. 1A to 1D, the electrode 44 (p electrode) is formed. The electrode 44 is formed in contact with the upper surface of the mesa stripe structure 14. The electrode 44 is formed so as to extend continuously from the upper surface of the mesa stripe structure 14 onto the passivation film 40. Further, another electrode 46 (n electrode) is formed on the back surface of the semiconductor substrate 18.

A manufacturing method of a buried type semiconductor optical device according to a second embodiment will be described. The buried type semiconductor optical device manufactured according to the present embodiment is the same as the buried type semiconductor optical device shown in FIG. 1. The present embodiment is the same as the first embodiment up to the process shown in FIG. 5B.

Figure 12:
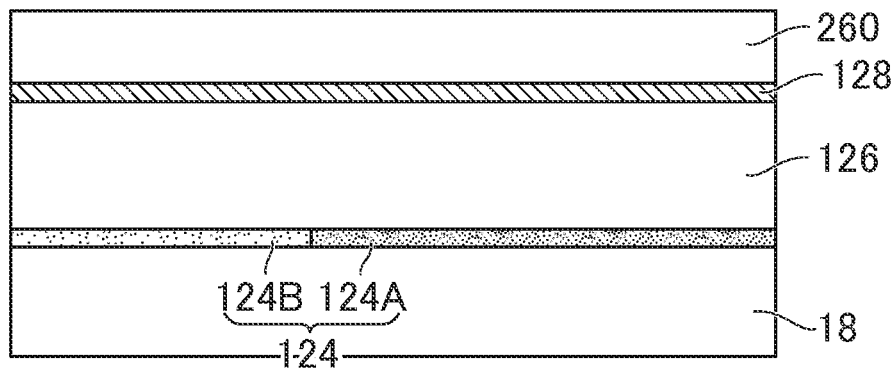
FIG. 12 is a view showing the formation process of an additional continuous layer in a second embodiment.
Figure 13A:
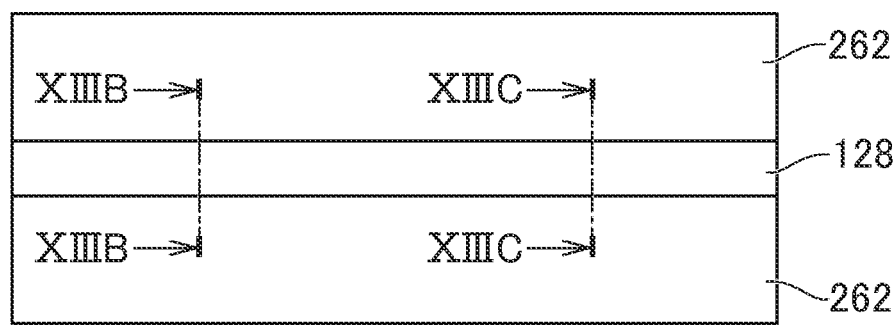
FIG. 13A is a view showing a process of patterning the additional continuous layer.
Figure 13B:
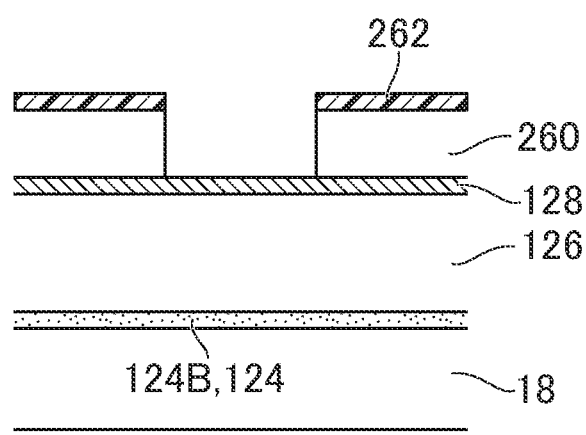
FIG. 13B is a cross-sectional view taken along the line XIIIB-XIIIB of the structure shown in FIG. 13A.
Figure 13C:
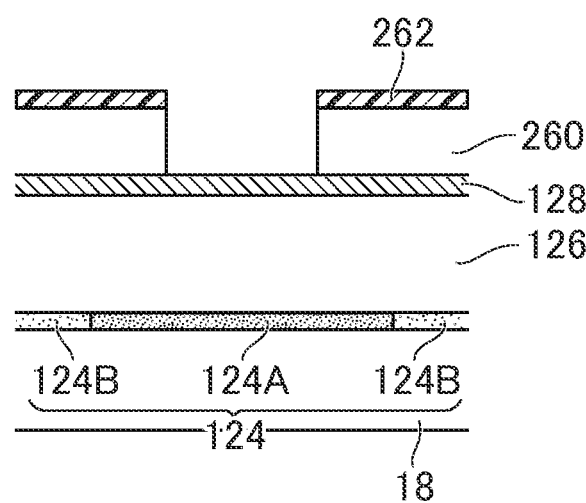
FIG. 13C is a cross-sectional view taken along the line XIIIC-XIIIC of the structure shown in FIG. 13A.

FIG. 12 is a view showing the formation process of an additional continuous layer in the second embodiment. An additional continuous layer 260 made of the same material as the continuous cladding layer 126 is formed on the continuous contact layer 128. FIG. 13A is a view showing a process of patterning the additional continuous layer. FIG. 13B is a cross-sectional view taken along the line of the structure shown in FIG. 13A. FIG. 13C is a cross-sectional view taken along the line XIIIC-XIIIC of the structure shown in FIG. 13A.

The additional continuous layer 260 is patterned so as to avoid regions corresponding to the mesa stripe structure 14 and the pair of grooves 20. The patterning is performed by etching using an additional mask 262. The etching is performed to leave the continuous contact layer 128. Thereafter, the additional mask 262 is removed.

Figure 14A:
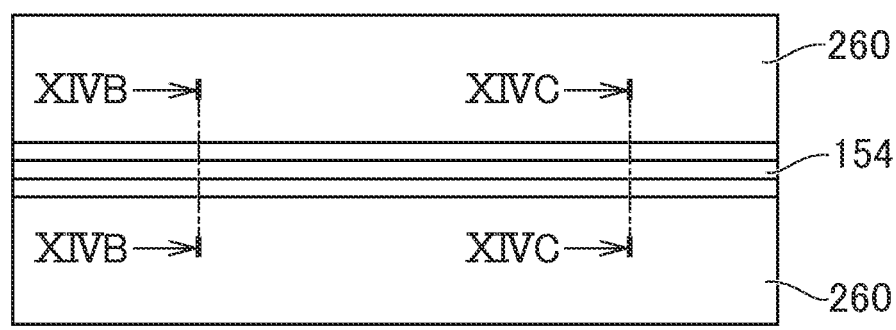
FIG. 14A is a view showing etching through a mesa mask portion.
Figure 14B:
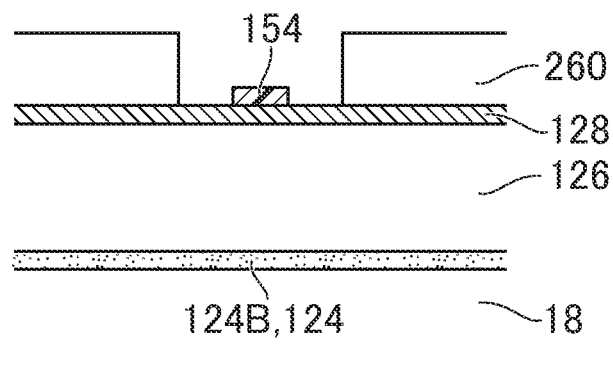
FIG. 14B is a cross-sectional view taken along the line XIVB-XIVB of the structure shown in FIG. 14A.
Figure 14C:
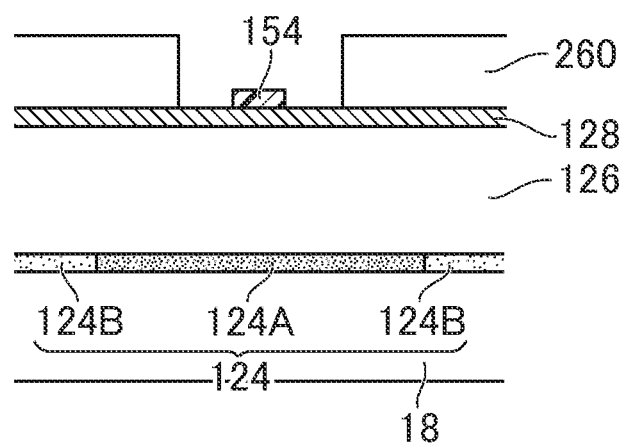
FIG. 14C is a cross-sectional view taken along the line XIVC-XIVC of the structure shown in FIG. 14A.

FIG. 14A is a view showing etching through a mesa mask portion. FIG. 14B is a cross-sectional view along the line XIVB-XIVB of the structure shown in FIG. 14A. FIG. 14C is a cross-sectional view along the line XIVC-XIVC of the structure shown in FIG. 14A. The mesa mask portion 154 is formed on the continuous contact layer 128 in a region corresponding to the mesa stripe structure 14.

Figure 7B:
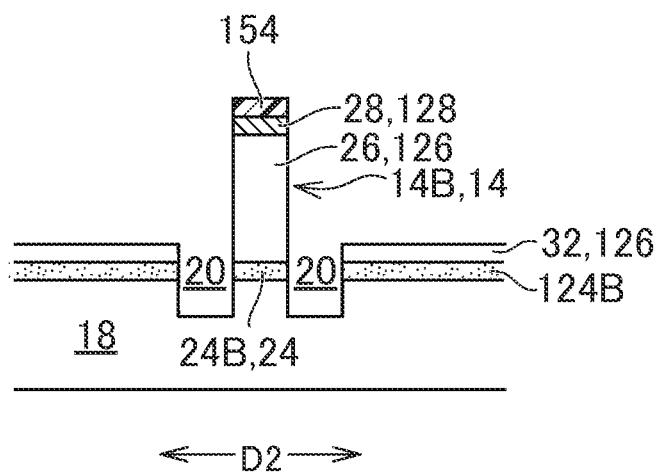
FIG. 7B is a cross-sectional view taken along the line VIIB-VIIB of the structure shown in FIG. 7A.
Figure 7C:
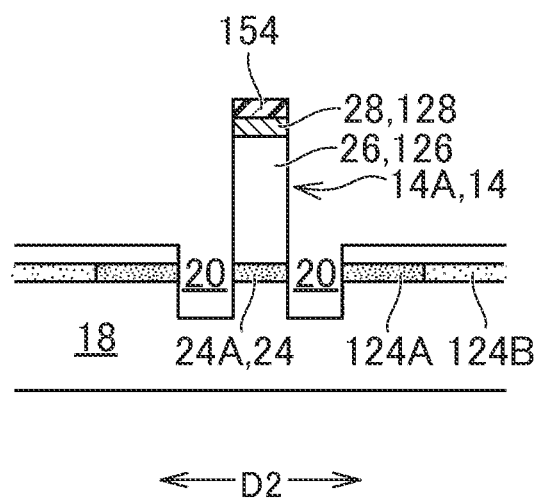
FIG. 7C is a cross-sectional view taken along the line VIIC-VIIC of the structure shown in FIG. 7A.

Then, the additional continuous layer 260, the continuous contact layer 128, the continuous cladding layer 126, the continuous quantum well layer 124, and the semiconductor substrate 18 are etched until the pair of grooves 20 is formed (see FIGS. 7A, 7B, and 7C).

Etching is performed with the continuous contact layer 128 covered by the mesa mask portion 154. That is, the mesa stripe structure 14 is left without being etched. Since a part of the continuous contact layer 128 (a portion covered by the mesa mask portion 154 but exposed from the additional continuous layer 260) is lower than the additional continuous layer 260, the etching reaches the semiconductor substrate 18 before the lower portion of the additional continuous layer 260. Thus, a pair of grooves 20 is formed in the semiconductor substrate 18. Meanwhile, in the region covered by the additional continuous layer 260, the etching is finished so that the lower portion (the portion to be the dummy cladding layer 32) of the continuous cladding layer 126 is left.

By the above process, the structures shown in FIGS. 7A, 7B, and 7C are obtained. Thereafter, the buried type semiconductor optical device can be manufactured by performing the processes shown in FIG. 8A and thereafter.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A buried type semiconductor optical device comprising:
    a semiconductor substrate that includes a pair of grooves extending in a first direction and includes a convex portion extending in a stripe shape in the first direction between the pair of grooves to constitute a lower end of a mesa stripe structure;
    a quantum well layer that extends in a stripe shape in the first direction on the convex portion so as to constitute a part of the mesa stripe structure;
    a buried layer that is placed on the semiconductor substrate while being adjacent to both sides of the mesa stripe structure in a second direction orthogonal to the first direction so as to constitute a buried heterostructure;
    an electrode that extends continuously from an upper surface of the mesa stripe structure onto the buried layer and contacts the upper surface of the mesa stripe structure; and
    a passivation film that is interposed between a part of an upper surface of the buried layer and the electrode,
        wherein the upper surface of the buried layer includes:
            a first region that is adjacent to the mesa stripe structure, overlaps with a corresponding one of the pair of grooves, is inclined so as to be higher in the second direction from the mesa stripe structure, and on which the passivation film is not formed,
            a second region that does not overlap with any of the pair of grooves, is flat, and is higher than a lower end of the first region, and on which the passivation film is formed, and
            a connection region that is between the first region and the second region at a same height as the second region.

2. The buried type semiconductor optical device of claim 1, wherein the buried layer is made of a semi-insulating semiconductor material.

3. The buried type semiconductor optical device of claim 1, wherein the lower end of the first region is at a same height as the upper surface of the mesa stripe structure.

4. The buried type semiconductor optical device of claim 1, further comprising:
    a dummy quantum well layer that is interposed between the buried layer and the semiconductor substrate while avoiding overlapping with the pair of grooves, made of a same material as the quantum well layer, and is equal in thickness to the quantum well layer.

5. The buried type semiconductor optical device of claim 4, wherein the mesa stripe structure includes:
    a cladding layer on the quantum well layer; and
    a dummy cladding layer that is interposed between the buried layer and the dummy quantum well layer, made of a same material as the cladding layer, and is smaller in thickness than the cladding layer.

6. The buried type semiconductor optical device of claim 1, wherein the buried layer is in direct contact with the semiconductor substrate by the pair of grooves.

7. The buried type semiconductor optical device of claim 1, wherein:
    the mesa stripe structure includes a first mesa stripe structure for a laser and a second mesa stripe structure for a modulator,
    the quantum well layer includes a first quantum well layer for the laser and a second quantum well layer for the modulator, and
    the electrode includes a first electrode for the laser and a second electrode for the modulator.

8. An optical device comprising:
    a semiconductor substrate that includes a pair of grooves extending in a first direction and includes a convex portion extending in a stripe shape in the first direction between the pair of grooves to constitute a lower end of a mesa stripe structure;
    a quantum well layer that extends in a stripe shape in the first direction on the convex portion so as to constitute a part of the mesa stripe structure;
    a buried layer that is placed on the semiconductor substrate while being adjacent to both sides of the mesa stripe structure in a second direction orthogonal to the first direction so as to constitute a buried heterostructure;

an electrode that extends continuously from an upper surface of the mesa stripe structure onto the buried layer and contacts the upper surface of the mesa stripe structure; and a passivation film that is interposed between a part of an upper surface of the buried layer and the electrode wherein the upper surface of the buried layer includes:
- a first region that is adjacent to the mesa stripe structure and overlaps with a corresponding one of the pair of grooves,
- a second, flat region that does not overlap with any of the pair of grooves, and
- a connection region that is between the first region and the second, flat region.

9. The optical device of claim 8, wherein the buried layer is made of a semi-insulating semiconductor material.

10. The optical device of claim 8, wherein the lower end of the first region is at a same height as the upper surface of the mesa stripe structure.

11. The optical device of claim 8, further comprising:
a dummy quantum well layer that is interposed between the buried layer and the semiconductor substrate while avoiding overlapping with the pair of grooves, made of a same material as the quantum well layer, and is equal in thickness to the quantum well layer.

12. The optical device of claim 11, wherein the mesa stripe structure includes:
a cladding layer on the quantum well layer; and
a dummy cladding layer that is interposed between the buried layer and the dummy quantum well layer, made of a same material as the cladding layer, and is smaller in thickness than the cladding layer.

13. The optical device of claim 8, wherein the buried layer is in direct contact with the semiconductor substrate by the pair of grooves.

14. The optical device of claim 8, wherein:
the mesa stripe structure includes a first mesa stripe structure for a laser and a second mesa stripe structure for a modulator,
the quantum well layer includes a first quantum well layer for the laser and a second quantum well layer for the modulator, and
the electrode includes a first electrode for the laser and a second electrode for the modulator.

15. A method of manufacturing a buried type semiconductor optical device, the method comprising:
preparing a semiconductor substrate that includes a pair of grooves extending in a first direction and a convex portion between the pair of grooves and is provided with a mesa stripe structure extending in a stripe shape in the first direction with the convex portion as a lower end portion, in which the mesa stripe structure includes a quantum well layer, a cladding layer, and a contact layer extending in a stripe shape in the first direction on the convex portion;
forming a buried layer constituting a buried heterostructure by crystal growth so as to be placed on the semiconductor substrate while being adjacent to both sides of the mesa stripe structure in a second direction orthogonal to the first direction;
forming a passivation film on a second region of an upper surface of the buried layer while avoiding a first region of the upper surface of the buried layer and an upper surface of the mesa stripe structure; and
forming an electrode so as to be in contact with the upper surface of the mesa stripe structure and extend continuously from the upper surface of the mesa stripe structure onto the passivation film, wherein:
the first region is adjacent to the mesa stripe structure, overlaps with a corresponding one of the pair of grooves, and is inclined so as to be higher in the second direction from the mesa stripe structure,
the second region does not overlap with any of the pair of grooves, is flat, and is higher than a lower end of the first region, and
the upper surface of the buried layer further includes a connection region between the first region and the second region at a same height as the second region.

16. The method of claim 15, wherein:
preparing the semiconductor substrate includes:
forming a continuous quantum well layer including a portion to be the quantum well layer on the semiconductor substrate;
forming a continuous cladding layer including a portion to be the cladding layer on the continuous quantum well layer;
forming a continuous contact layer including a portion to be the contact layer on the continuous cladding layer; and
etching the continuous contact layer, the continuous cladding layer, the continuous quantum well layer, and the semiconductor substrate.

17. The method of claim 16, further comprising:
forming an etching mask having openings corresponding to the pair of grooves on the continuous contact layer;
forming recessed portions corresponding to the pair of grooves in the continuous contact layer and the continuous cladding layer so as not to reach the semiconductor substrate through the etching mask; and
removing the etching mask by leaving a part of the etching mask as a mesa mask portion in a region corresponding to the mesa stripe structure.

18. The method of claim 17, wherein the continuous contact layer, the continuous cladding layer, the continuous quantum well layer, and the semiconductor substrate are etched until the pair of grooves are formed with the continuous contact layer covered by the mesa mask portion.

19. The method of claim 16, further comprising:
before the etching,
forming an additional continuous layer made of a same material as the continuous cladding layer on the continuous contact layer while avoiding regions corresponding to the mesa stripe structure and the pair of grooves; and
forming a mesa mask portion in a region corresponding to the mesa stripe structure on the continuous contact layer,
wherein the additional continuous layer, the continuous contact layer, the continuous cladding layer, the continuous quantum well layer, and the semiconductor substrate are etched until the pair of grooves are formed with the continuous contact layer covered by the mesa mask portion.

20. The method of claim 16, wherein:
a lower portion of the continuous cladding layer is left except for regions corresponding to the pair of grooves,
the crystal growth is based on a crystal of the semiconductor substrate below the first region, and
the crystal growth is based on a crystal of the continuous cladding layer below the second region.

* * * * *